(12) United States Patent
Hirano et al.

(10) Patent No.: US 6,756,692 B2
(45) Date of Patent: Jun. 29, 2004

(54) SEMICONDUCTOR STORAGE DEVICE HAVING HIGH SOFT-ERROR IMMUNITY

(75) Inventors: Yuuichi Hirano, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/201,921

(22) Filed: Jul. 25, 2002

(65) Prior Publication Data

US 2003/0031040 A1 Feb. 13, 2003

(30) Foreign Application Priority Data

Aug. 10, 2001 (JP) ......................................... 2001-243292

(51) Int. Cl.[7] .............................................. H01L 27/11
(52) U.S. Cl. ...................................... 257/903; 257/393
(58) Field of Search ................................ 257/393, 903, 257/904

(56) References Cited

U.S. PATENT DOCUMENTS

| | | | | |
|---|---|---|---|---|
| 5,373,170 A | * | 12/1994 | Pfiester et al. .................. | 257/69 |
| 5,395,783 A | | 3/1995 | Baumann et al. ............ | 438/239 |
| 5,422,499 A | * | 6/1995 | Manning ....................... | 257/67 |
| 6,020,242 A | * | 2/2000 | Tsai et al. ..................... | 438/279 |
| 6,429,124 B1 | * | 8/2002 | Tang et al. ................... | 438/643 |

FOREIGN PATENT DOCUMENTS

| | | |
|---|---|---|
| DE | 690 09 157 | 9/1994 |
| EP | 0 432 057 | 6/1991 |
| JP | 5-235301 | 9/1993 |
| JP | 6-188388 | 7/1994 |

OTHER PUBLICATIONS

Ross A. Kohler, et al., "Seu Characterization of Hardened CMOS SRAMS Using Statistical Analysis of Feedback Delay in Memory Cells", IEEE Transactions on Nuclear Science, vol. 36, No. 6, Dec. 1989, pp. 2318–2323.

* cited by examiner

Primary Examiner—Allan R. Wilson
(74) Attorney, Agent, or Firm—Oblon, Spivak, McClelland, Maier & Neustadt, P.C.

(57) ABSTRACT

A semiconductor storage device with high soft-error immunity is obtained. A semiconductor storage device has SRAM memory cells. NMOS transistors are driver transistors, NMOS transistors are access transistors, and PMOS transistors are load transistors. An NMOS transistor is a transistor for adding a resistance. The NMOS transistor has its gate connected to a power supply. The NMOS transistor has one of its source and drain connected to a storage node and the other connected to the gates of the NMOS transistor and the PMOS transistor. The resistance between the source and drain of the NMOS transistor can be adjusted with the gate length, the gate width, the source/drain impurity concentration, etc., which is, for example, about several tens of kilohms (k Ω).

5 Claims, 17 Drawing Sheets

F I G. 1
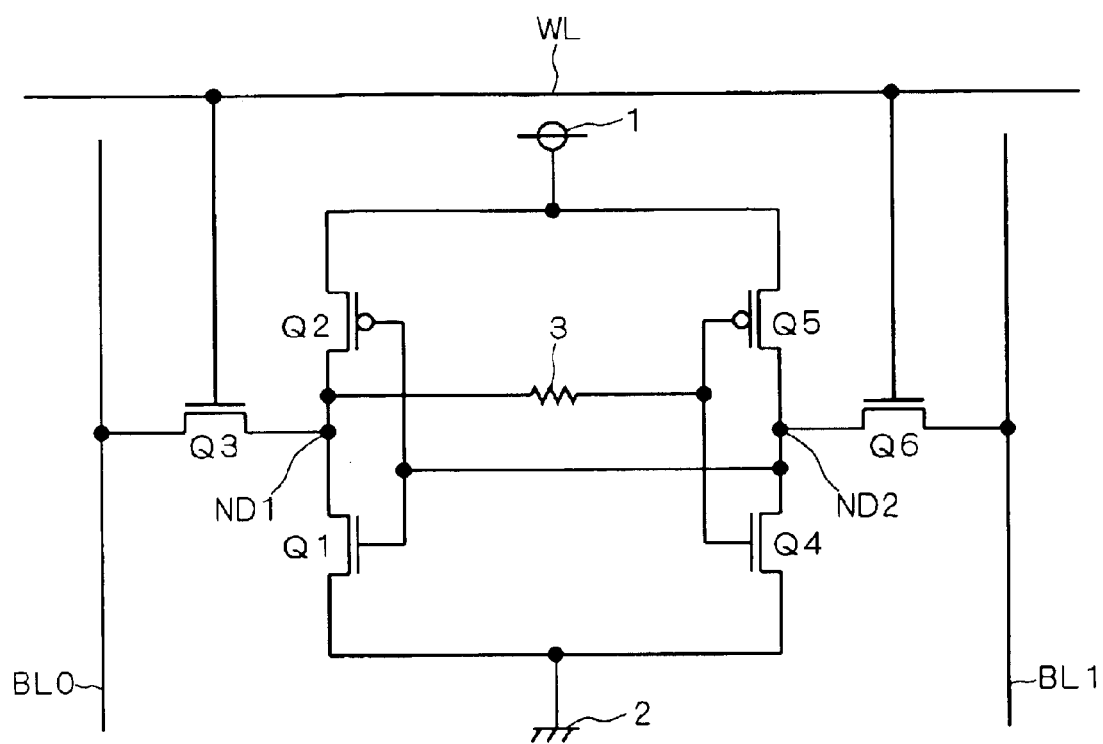

F I G. 2
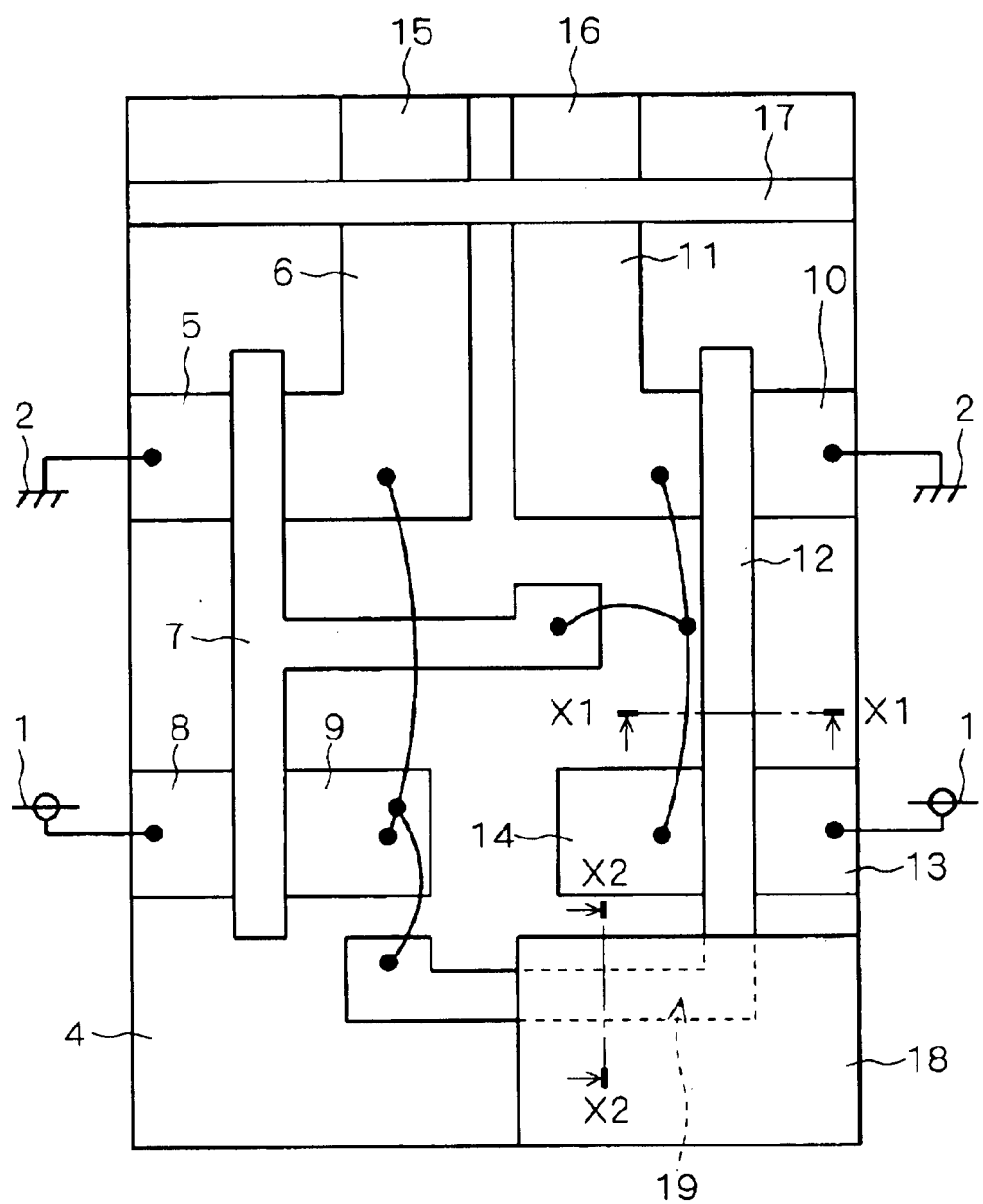

F I G. 11
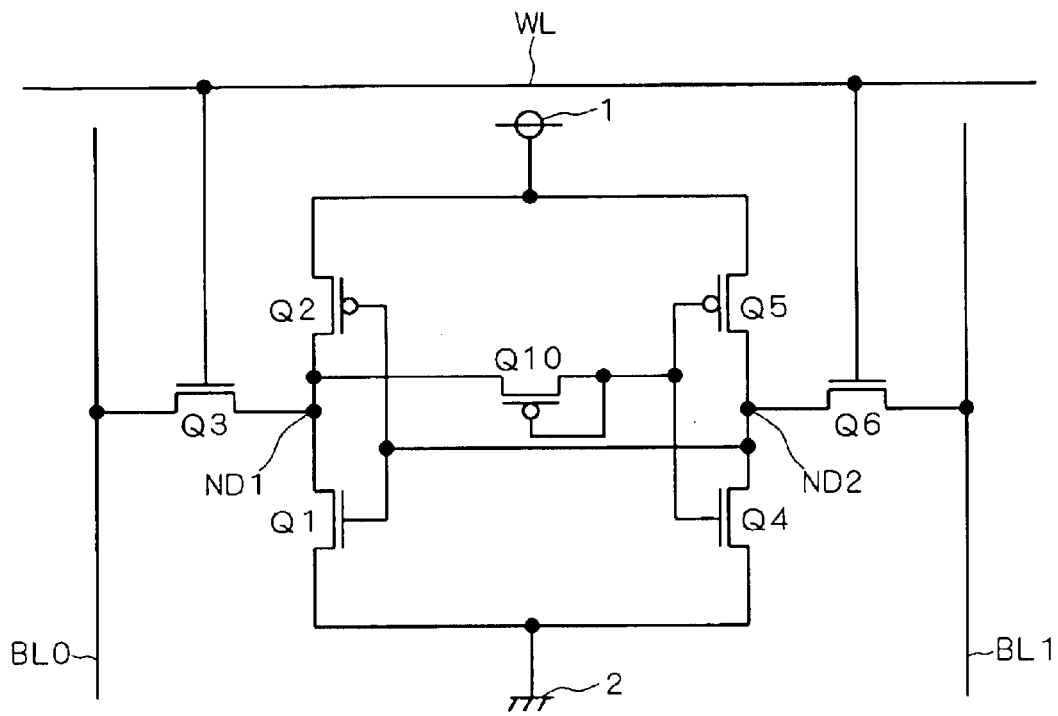
F I G. 12
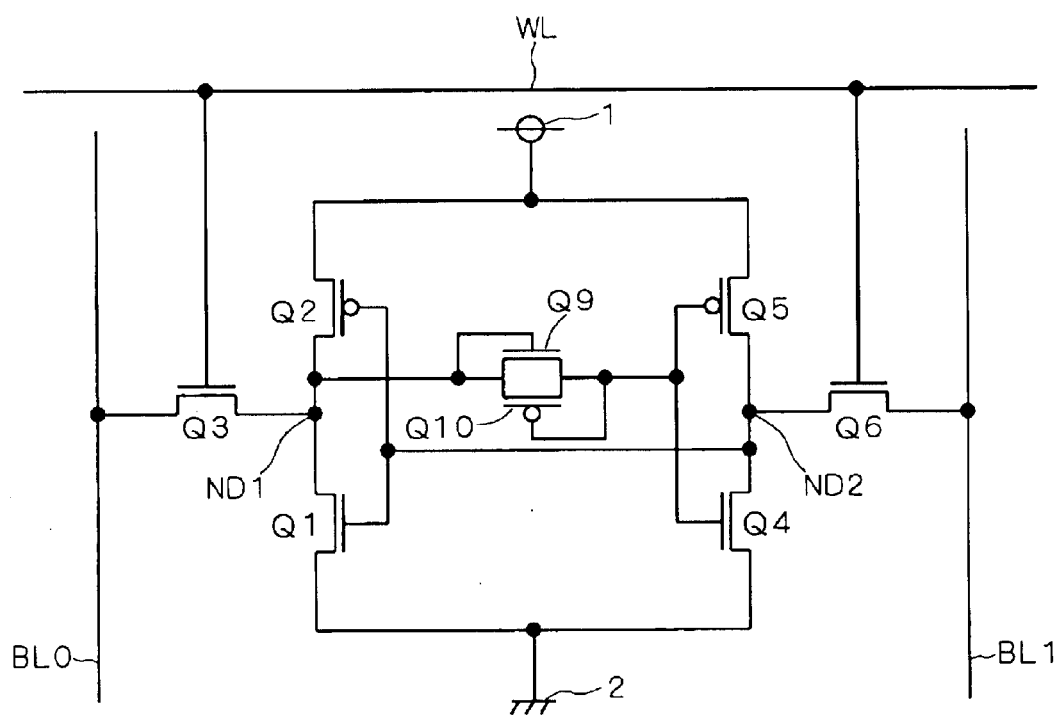

SEMICONDUCTOR STORAGE DEVICE HAVING HIGH SOFT-ERROR IMMUNITY

BACKGROUND OF THE INVENTION

1. Field of the Invention

The present invention relates to semiconductor storage devices, and particularly to the structure of a semiconductor storage device having SRAM (Static Random Access Memory) memory cells.

2. Description of the Background Art

FIG. 24 is a circuit diagram showing the structure of a conventional SRAM memory cell. The NMOS transistors Q1 and Q4 are transistors for driving (referred to also as "driver transistors") and the NMOS transistors Q3 and Q6 are transistors for accessing (referred to also as "access transistors"). The PMOS transistors Q2 and Q5 are transistors for load (load transistors); the PMOS transistors Q2 and Q5 may be replaced by resistor elements.

The NMOS transistors Q1 and Q4 have their respective sources connected to a power supply 2 which gives a GND potential. The PMOS transistors Q2 and Q5 have their respective sources connected to a power supply 1 which gives a given power-supply potential (Vdd). The NMOS transistor Q1 and the PMOS transistor Q2 have their respective drains connected to a storage node ND1. The NMOS transistor Q4 and the PMOS transistor Q5 have their respective drains connected to a storage node ND2. The storage node ND1 is connected to the gates of the NMOS transistor Q4 and the PMOS transistor Q5. The storage node ND2 is connected to the gates of the NMOS transistor Q1 and the PMOS transistor Q2. The NMOS transistor Q3 has its gate connected to a word line WL, its source connected to the storage node ND1, and its drain connected to a bit line BL0. The NMOS transistor Q6 has its gate connected to the word line WL, its source connected to the storage node ND2, and its drain connected to a bit line BL1.

FIG. 25 is a top view schematically showing the structure of the conventional SRAM memory cell. Element isolation insulating film 4 is partially formed on a silicon substrate to define element formation regions. The NMOS transistor Q1 shown in FIG. 24 has a source region 5 and a drain region 6, both of which are n$^+$ type. The PMOS transistor Q2 has a source region 8 and a drain region 9, both of which are p$^+$ type. The NMOS transistor Q4 has a source region 10 and a drain region 11, both of which are n$^+$ type. The PMOS transistor Q5 has a source region 13 and a drain region 14, both of which are p$^+$ type. The NMOS transistor Q3 has a source region 6 and a drain region 15, both of which are n$^+$ type, and the NMOS transistor Q6 has a source region 11 and a drain region 16, both of which are n$^+$ type.

The NMOS transistor Q1 and the PMOS transistor Q2 have a common gate structure 7, the gate structure 7 being connected to the drain regions 11 and 14 of the NMOS transistor Q4 and the PMOS transistor Q5. The NMOS transistor Q4 and the PMOS transistor Q5 have a common gate structure 12, the gate structure 12 being connected to the drain regions 6 and 9 of the NMOS transistor Q1 and the PMOS transistor Q2. The NMOS transistors Q3 and Q6 have a common gate structure 17, which functions as the word line WL.

The conventional semiconductor storage device thus constructed is prone to a phenomenon (soft error) in which stored information is upset when ionizing radiation, such as alpha ($\alpha$) rays emitted from the package material etc., enters the memory cells.

For example, referring to FIG. 24, suppose that the potential at the storage node ND1 is at a high level and the potential at the storage node ND2 is at a low level. Under this condition, when an alpha-ray is incident in the drain of the NMOS transistor Q1, the alpha-radiation generates a large number of electron-hole pairs and the electrons are collected by the drain of the NMOS transistor Q1, which causes the potential at the storage node ND1 to change from the high level to the low level. The potential change at the storage node ND1 is then transferred to the NMOS transistor Q4 and the PMOS transistor Q5, causing the potential at the storage node ND2 to change from the low level to the high level. The potential change at the storage node ND2 is then transferred to the NMOS transistor Q1 and the PMOS transistor Q2. The information stored in the semiconductor storage device is thus destroyed.

SUMMARY OF THE INVENTION

An object of the present invention is to obtain a semiconductor storage device having high soft-error immunity.

According to a first aspect of the present invention, a semiconductor storage device includes a static random access memory cell which includes a first driver transistor, a first load element, and a first access transistor which are connected to each other through a first storage node, and a second driver transistor, a second load element, and a second access transistor which are connected to each other through a second storage node, the first driver transistor having a first gate electrode connected to the second storage node, the second driver transistor having a second gate electrode connected to the first storage node. The semiconductor storage device further includes a first protection film formed to cover part of the first gate electrode. Part of the first gate electrode which is not covered by the first protection film has a structure in which a first semiconductor layer and a first metal-semiconductor compound layer are stacked in this order on a first gate insulating film. The part of the first gate electrode which is covered by the first protection film has a structure in which the first semiconductor layer is formed on the first gate insulating film and the first metal-semiconductor compound layer is not formed on the first semiconductor layer.

The second storage node is connected to the first driver transistor through a high resistance portion of the first gate electrode which is covered by the first protection film and where the first metal-semiconductor compound layer is absent. This enhances the soft-error immunity of the semiconductor storage device.

According to a second aspect of the invention, another semiconductor storage device includes a static random access memory cell which includes a first driver transistor, a first load element, and a first access transistor which are connected to each other through a first storage node, and a second driver transistor, a second load element, and a second access transistor which are connected to each other through a second storage node, the first driver transistor having a first gate electrode connected to the second storage node, the second driver transistor having a second gate electrode connected to the first storage node. The semiconductor storage device further includes a first resistance-adding transistor having a first impurity-containing region connected to the first gate electrode and a second impurity-containing region connected to the second storage node, and the first gate electrode is connected to the second storage node through the first resistance-adding transistor.

The first gate electrode is connected to the second storage node through the first resistance-adding transistor, which enhances the soft-error immunity of the semiconductor storage device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing the structure of an SRAM memory cell according to a first preferred embodiment of the present invention;

FIG. 2 is a top view schematically showing the structure of the SRAM memory cell of the first preferred embodiment of the present invention;

FIG. 11 is a circuit diagram showing the structure of an SRAM memory cell according to a first variation of the fourth preferred embodiment of the present invention;

FIG. 12 is a circuit diagram showing the structure of an SRAM memory cell according to a second variation of the fourth preferred embodiment of the present invention;

DESCRIPTION OF THE PREFERRED EMBODIMENTS

First Preferred Embodiment

Figure 3:
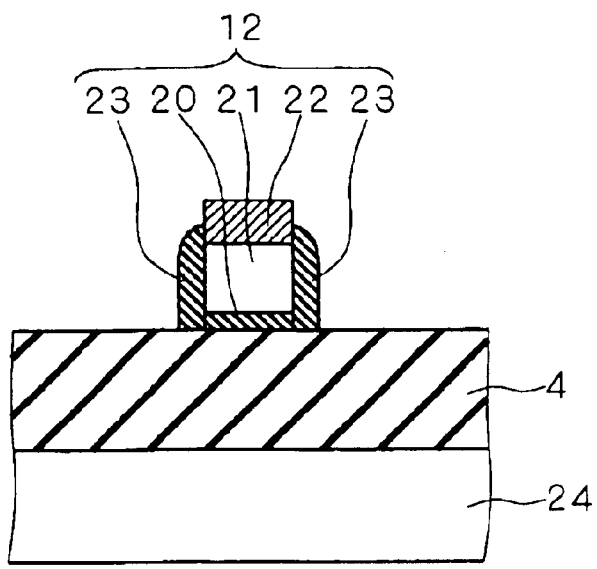
FIG. 3 is a cross section showing the sectional structure taken along the segment X1—X1 shown in FIG. 2.

FIG. 1 is a circuit diagram showing the structure of an SRAM memory cell according to a first preferred embodiment of the present invention. The NMOS transistors Q1 and Q4 are transistors for driving (referred to also as "driver transistors") and the NMOS transistors Q3 and Q6 are transistors for accessing (referred to also as "access transistors"). The PMOS transistors Q2 and Q5 are transistors for load (load transistors); the PMOS transistors Q2 and Q5 may be replaced by resistor elements.

The NMOS transistors Q1 and Q4 have their respective sources connected to a power supply 2 which gives a GND potential. The PMOS transistors Q2 and Q5 have their respective sources connected to a power supply 1 which gives a given power-supply potential Vdd (about 0.5 to 5.0 V). The NMOS transistor Q1 and the PMOS transistor Q2 have their respective drains connected to a storage node ND1. The NMOS transistor Q4 and the PMOS transistor Q5 have their respective drains connected to a storage node ND2. The storage node ND1 is connected to the gates of the NMOS transistor Q4 and the PMOS transistor Q5 through a resistor 3. The storage node ND2 is connected to the gates of the NMOS transistor Q1 and the PMOS transistor Q2. The NMOS transistor Q3 has its gate connected to a word line WL, its source connected to the storage node ND1, and its drain connected to a bit line BL0. The NMOS transistor Q6 has its gate connected to the word line WL, its source connected to the storage node ND2, and its drain connected to a bit line BL1.

FIG. 2 is a top view schematically showing the structure of the SRAM memory cell of the first preferred embodiment. Element isolation insulating film 4 is partially formed on a silicon substrate to define element formation regions. The NMOS transistor Q1 shown in FIG. 1 has a source region 5 and a drain region 6, both of which are n$^+$ type. The PMOS transistor Q2 has a source region 8 and a drain region 9, both of which are p$^+$ type. The NMOS transistor Q4 has a source region 10 and a drain region 11, both of which are n$^+$ type. The PMOS transistor Q5 has a source region 13 and a drain region 14, both of which are p$^+$ type. The NMOS transistor Q3 has a source region 6 and a drain region 15, both of which are n$^+$ type, and the NMOS transistor Q6 has a source region 11 and a drain region 16, both of which are n$^+$ type.

The NMOS transistor Q1 and the PMOS transistor Q2 have a common gate structure 7, the gate structure 7 being connected to the drain regions 11 and 14 of the NMOS transistor Q4 and the PMOS transistor Q5. The NMOS transistor Q4 and the PMOS transistor Q5 have a common gate structure 12, the gate structure 12 being connected to the drain regions 6 and 9 of the NMOS transistor Q1 and the PMOS transistor Q2. Part of the gate structure 12 is covered by a silicide protection 18 composed of a silicon oxide film. The part of the gate structure 12 which is covered by the silicide protection 18 is defined as a high resistance portion 19 having a higher resistance value than the part of the gate structure 12 which is not covered by the silicide protection 18. The NMOS transistors Q3 and Q6 have a common gate structure 17, which functions as the word line WL.

FIG. 3 is a cross section showing the sectional structure taken along the segment X1—X1 shown in FIG. 2. The element isolation insulating film 4 composed of a silicon oxide film is formed on a silicon substrate 24 and the gate structure 12 is formed on the element isolation insulating film 4. The gate structure 12 has a structure in which a polysilicon layer 21 and a cobalt silicide layer 22 are stacked in this order on a gate insulating film 20 composed of a silicon oxide film and side walls 23 composed of a silicon oxide film are formed on the sides of this stacked structure. The concentration of impurity introduced in the polysilicon layer 21 is about $1 \times 10^{17}$ to $1 \times 10^{21}$ cm$^{-3}$, and the sheet resistance of the gate structure 12 is about several tens of ohms per square ($\Omega/\square$).

Figure 4:
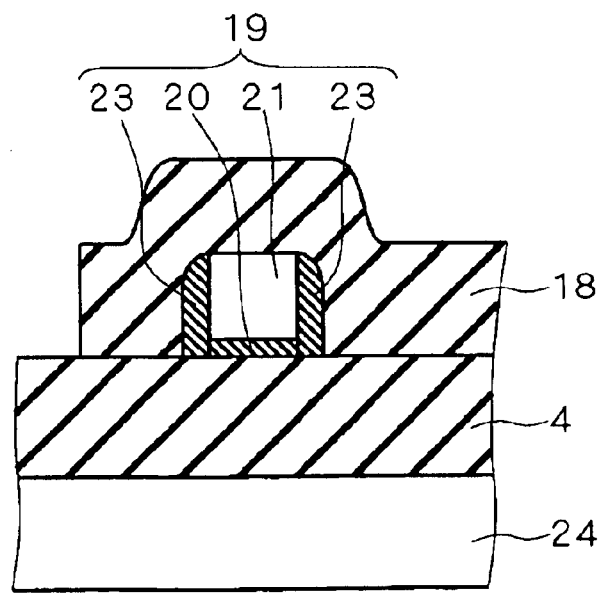
FIG. 4 is a cross section showing the sectional structure taken along the segment X2—X2 shown in FIG. 2.

FIG. 4 is a cross section showing the sectional structure taken along the segment X2—X2 shown in FIG. 2. The high resistance portion 19 of the gate structure 12 is formed on the element isolation insulating film 4. This high resistance portion 19 corresponds to the resistor 3 shown in FIG. 1. The high resistance portion 19 has a structure in which the polysilicon layer 21 is formed on the gate insulating film 20 and the side walls 23 are formed on the sides of this structure. In the high resistance portion 19, the cobalt silicide layer 22 is absent on the polysilicon layer 21. The sheet resistance of the high resistance portion 19 is about several hundred kilohms per square (k$\Omega/\square$), which is higher than the sheet resistance of the part of the gate structure 12 other than the high resistance portion 19.

The structure shown in FIGS. 3 and 4 can be formed by conducting the following steps in this order: (A) forming a gate structure in which the polysilicon layer 21 is formed on the gate insulating film 20; (B) forming the side walls 23 on the sides of this gate structure; (C) forming the silicide protection 18 on the region where the high resistance portion 19 is to be formed; and (D) silicidizing the polysilicon layer 21 in the part not covered by the silicide protection 18 to form the cobalt silicide layer 22.

As shown above, according to the semiconductor storage device of the first preferred embodiment, as shown in FIG. 1, the storage node ND1 is connected to the gates of the NMOS transistor Q4 and the PMOS transistor Q5 through the resistor 3. This enhances the soft-error immunity of the semiconductor storage device.

The reason is now described specifically. Referring to FIG. 1, suppose that the potential at the storage node ND1 is at a high level and the potential at the storage node ND2 is at a low level. When an alpha ($\alpha$) ray is incident in the drain of the NMOS transistor Q1 under this condition, the alpha-radiation generates a large number of electron-hole pairs. The electrons are collected by the drain of the NMOS transistor Q1, which causes the potential at the storage node ND1 to change from the high level to the low level. The potential change at the storage node ND1 is then gradually transferred to the NMOS transistor Q4 and the PMOS transistor Q5 according to the time constant determined by the resistance value of the resistor 3 and the gate capacitances of the NMOS transistor Q4 and the PMOS transistor Q5. That is to say, the resistor 3 delays the time required for the potential change at the storage node ND1 to reach the NMOS transistor Q4 and the PMOS transistor Q5, so that the potential at the storage node ND2 is not immediately changed.

On the other hand, before the potential at the storage node ND2 changes, the potential at the storage node ND2 (low level) remains applied to the gates of the NMOS transistor Q1 and the PMOS transistor Q2. Accordingly, even when the potential at the storage node ND1 has changed from the high level to the low level due to the alpha-ray radiation, the potential at the storage node ND1 returns to the high level. As a result the potential at the storage node ND2 is held at the low level. The soft-error immunity of the semiconductor storage device is thus enhanced.

Furthermore, the high resistance portion 19 of the gate structure 12 can be formed just by adding the easy process step of forming the silicide protection 18, without complicating the manufacturing process or increasing the chip area.

Second Preferred Embodiment

Figure 5:
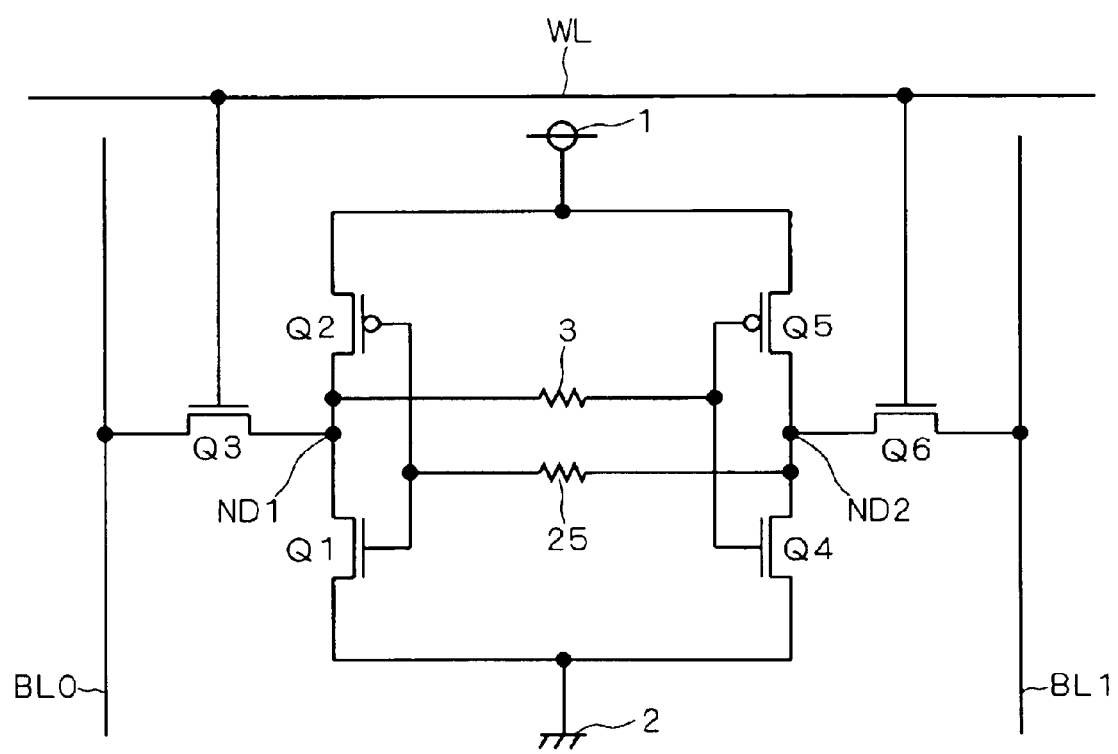
FIG. 5 is a circuit diagram showing the structure of an SRAM memory cell according to a second preferred embodiment of the present invention.

FIG. 5 is a circuit diagram showing the structure of an SRAM memory cell according to a second preferred embodiment of the present invention. The storage node ND2 is connected to the gates of the NMOS transistor Q1 and the PMOS transistor Q2 through a resistor 25. In other respects the structure of the SRAM memory cell of the second preferred embodiment is the same as that of the SRAM memory cell shown in FIG. 1 in the first preferred embodiment.

Figure 6:
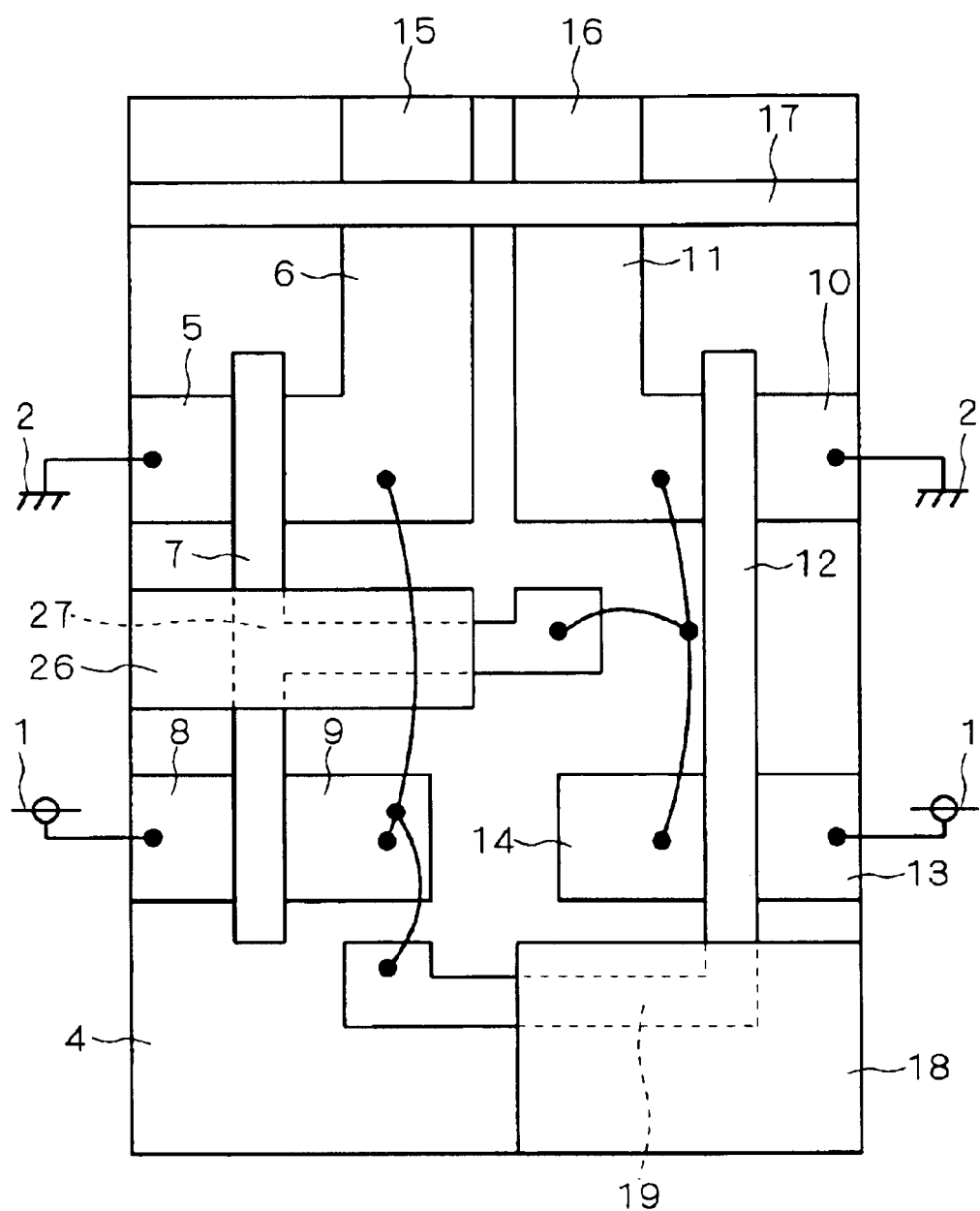
FIG. 6 is a top view schematically showing the structure of the SRAM memory cell of the second preferred embodiment of the present invention.

FIG. 6 is a top view schematically showing the structure of the SRAM memory cell of the second preferred embodiment. Part of the gate structure 7 is covered by a silicide protection 26 formed of a silicon oxide film. The part of the gate structure 7 which is covered by the silicide protection 26 is defined as a high resistance portion 27 having a higher resistance value than the part of the gate structure 7 which is not covered by the silicide protection 26. The high resistance portion 27 corresponds to the resistor 25 shown in FIG. 5. Like the high resistance portion 19 shown in FIG. 4, the high resistance portion 27 has a structure in which the polysilicon layer 21 is formed on the gate insulating film 20 and the side walls 23 are formed on the sides of this structure. In the high resistance portion 27, the cobalt silicide layer 22 is not formed on the polysilicon layer 21. The sheet resistance of the high resistance portion 27 is about several hundred kilohms per square (k$\Omega/\square$), which is higher than the sheet resistance of the part of the gate structure 7 other than the high resistance portion 27 (several tens of ohms per square ($\Omega/\square$)). In other respects the structure of the SRAM memory cell of the second preferred embodiment is the same as that of the SRAM memory cell shown in FIG. 2 in the first preferred embodiment.

As shown above, according to the semiconductor storage device of the second preferred embodiment, as shown in FIG. 5, the storage node ND1 is connected to the gates of the NMOS transistor Q4 and the PMOS transistor Q5 through the resistor 3. Also, the storage node ND2 is connected to the gates of the NMOS transistor Q1 and the PMOS transistor Q2 through the resistor 25. The soft-error immunity can thus be further enhanced as compared with the semiconductor storage device of the first preferred embodiment.

Third Preferred Embodiment

Figure 7:
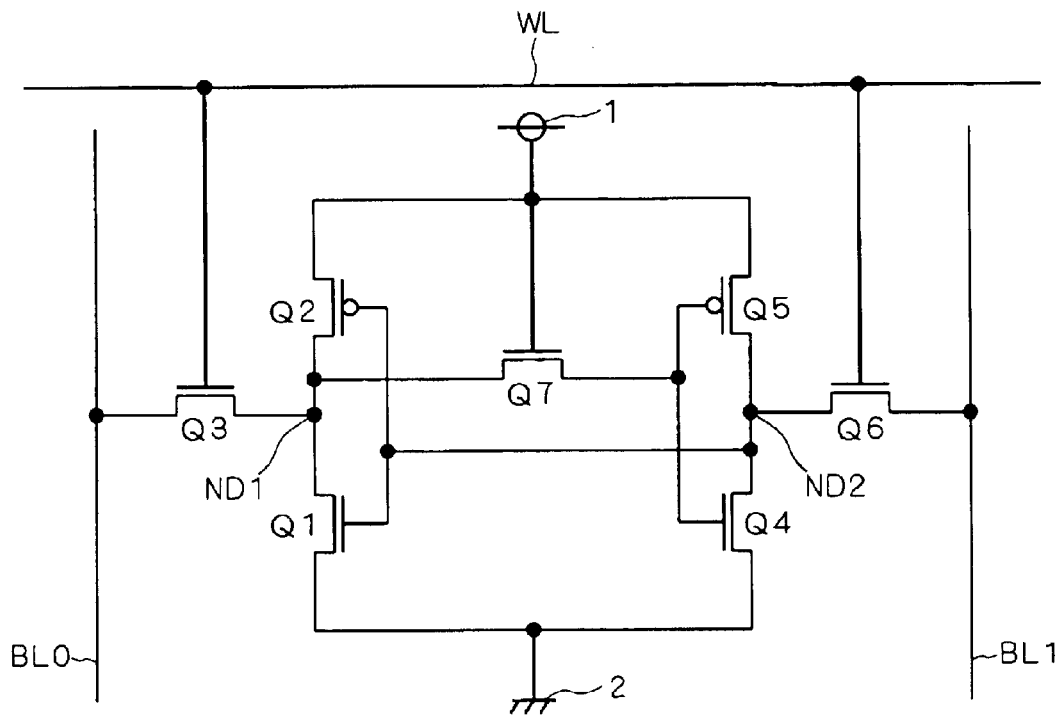
FIG. 7 is a circuit diagram showing the structure of an SRAM memory cell according to a third preferred embodiment of the present invention.

FIG. 7 is a circuit diagram showing the structure of an SRAM memory cell according to a third preferred embodiment of the present invention. It has an NMOS transistor Q7 formed in place of the resistor 3 shown in FIG. 1. The NMOS transistor Q7 has its gate connected to the power supply 1. Also, the NMOS transistor Q7 has one of its source and drain connected to the storage node ND1 and the other connected to the gates of the NMOS transistor Q4 and the PMOS transistor Q5. In other respects the structure of the SRAM memory cell of the third preferred embodiment is the same as that of the SRAM memory cell shown in FIG. 1 in the first preferred embodiment. The resistance between the source and drain of the NMOS transistor Q7 can be adjusted with the gate length, the gate width, the source/drain impurity concentration, etc., which is about several to several hundred kilohms (kΩ), for example.

As shown above, according to the semiconductor storage device of the third preferred embodiment, the source-drain resistance of the NMOS transistor Q7 can be added between the storage node ND1 and the gates of the NMOS transistor Q4 and the PMOS transistor Q5. In particular, in the semiconductor storage device of the third preferred embodiment, the on-state resistance of the NMOS transistor Q7 can be added. This enhances the soft-error immunity of the semiconductor storage device for the same reason described in the first preferred embodiment.

Furthermore, a desired value of resistance can be added since the source-drain resistance of the NMOS transistor Q7 can be adjusted with the gate length, the gate width, the source/drain impurity concentration, etc.

Figure 8:
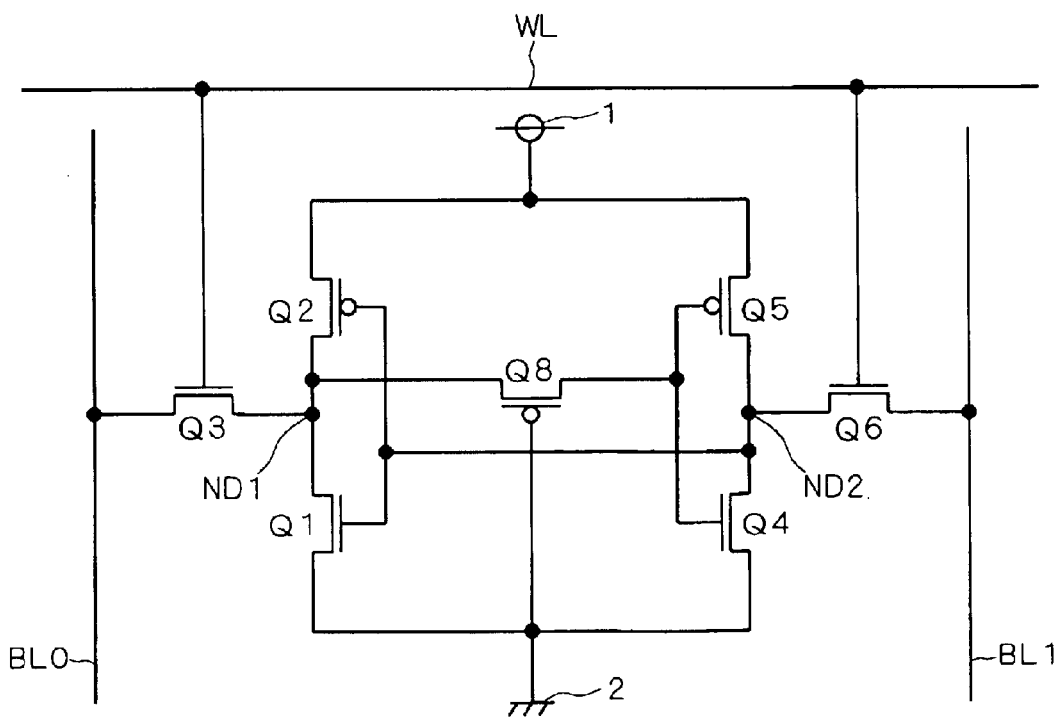
FIG. 8 is a circuit diagram showing the structure of an SRAM memory cell according to a first variation of the third preferred embodiment of the present invention.

FIG. 8 is a circuit diagram showing the structure of an SRAM memory cell according to a first variation of the third preferred embodiment of the invention. It has a PMOS transistor Q8 formed in place of the NMOS transistor Q7 shown in FIG. 7. The PMOS transistor Q8 has its gate connected to the power supply 2. Also, the PMOS transistor Q8 has one of its source and drain connected to the storage node ND1 and the other connected to the gates of the NMOS transistor Q4 and the PMOS transistor Q5.

Figure 9:
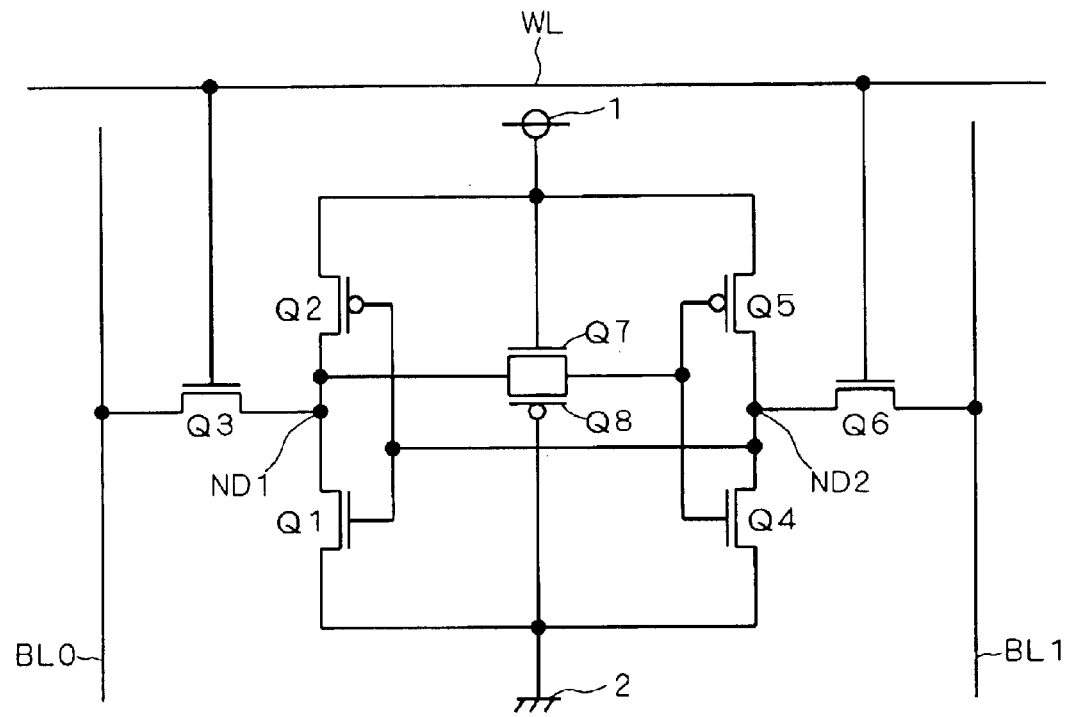
FIG. 9 is a circuit diagram showing the structure of an SRAM memory cell according to a second variation of the third preferred embodiment of the present invention.

FIG. 9 is a circuit diagram showing the structure of an SRAM memory cell according to a second variation of the third preferred embodiment of the invention. It has both the NMOS transistor Q7 shown in FIG. 7 and the PMOS transistor Q8 shown in FIG. 8.

The semiconductor storage devices of the first and second variations of the third preferred embodiment also provide the same effect as the semiconductor storage device shown in FIG. 7.

Fourth Preferred Embodiment

Figure 10:
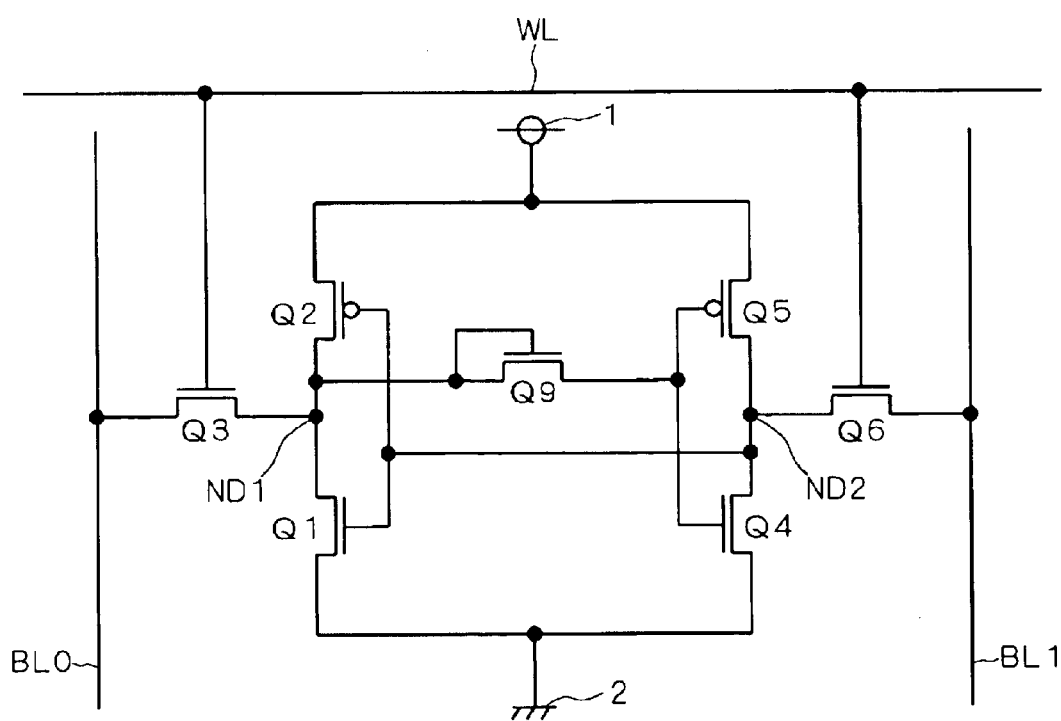
FIG. 10 is a circuit diagram showing the structure of an SRAM memory cell according to a fourth preferred embodiment of the present invention.

FIG. 10 is a circuit diagram showing the structure of an SRAM memory cell according to a fourth preferred embodiment of the invention. It has an NMOS transistor Q9 formed in place of the resistor 3 shown in FIG. 1. The NMOS transistor Q9 has one of its source and drain connected to the storage node ND1 and the other connected to the gates of the NMOS transistor Q4 and the PMOS transistor Q5. The NMOS transistor Q9 has its gate connected to an arbitrary one of its own source and drain.

In order to cause the NMOS transistor Q9 to electrically conduct between the source and drain, a transistor in which the source-channel-drain have $n^+$-n-$n^+$ conductivity types is adopted as the NMOS transistor Q9. Alternatively an absolute value of the threshold voltage of the NMOS transistor Q9 is set lower than those of other NMOS transistors Q1 and Q4. For example, it is set low so that application of a 0-V voltage to the gate results in a current flow of about several microamperes ($\mu$A) to several milliamperes (mA). In other respects the structure of the SRAM memory cell of the fourth preferred embodiment is the same as that of the SRAM memory cell shown in FIG. 1 in the first preferred embodiment.

As shown above, according to the semiconductor storage device of the fourth preferred embodiment, the resistance between the source and drain of the NMOS transistor Q9 can be added between the storage node ND1 and the gates of the NMOS transistor Q4 and the PMOS transistor Q5, which provides the same effect as that of the third preferred embodiment.

Furthermore, the gate capacitance of the NMOS transistor Q9 is added to the gate capacitances of the NMOS transistor Q4 and the PMOS transistor Q5, which apparently reduces the amount of change in potential at the storage nodes ND1 and ND2 caused by the alpha-ray radiation. As a result, as compared with the semiconductor storage device of the third preferred embodiment, the soft-error immunity can be further enhanced.

FIG. 11 is a circuit diagram showing the structure of an SRAM memory cell according to a first variation of the fourth preferred embodiment of the invention. It has a PMOS transistor Q10 formed in place of the NMOS transistor Q9 shown in FIG. 10. The PMOS transistor Q10 has one of its source and drain regions connected to the storage node ND1 and the other connected to the gates of the NMOS transistor Q4 and the PMOS transistor Q5. Also, the PMOS transistor Q10 has its gate connected to an arbitrary one of its own source and drain.

In order to cause the PMOS transistor Q10 to electrically conduct between the source and drain, a transistor in which its source-channel-drain have $p^+$-p-$p^+$ conductivity types is adopted as the PMOS transistor Q10. Alternatively an absolute value of the threshold voltage of the PMOS transistor Q10 is set lower than those of other PMOS transistors Q2 and Q5.

FIG. 12 is a circuit diagram showing the structure of an SRAM memory cell according to a second variation of the fourth preferred embodiment of the invention. It has both the NMOS transistor Q9 shown in FIG. 10 and the PMOS transistor Q10 shown in FIG. 11.

The semiconductor storage devices of the first and second variations of the fourth preferred embodiment also provide the same effect as the semiconductor storage device shown in FIG. 10.

Fifth Preferred Embodiment

Figure 13:
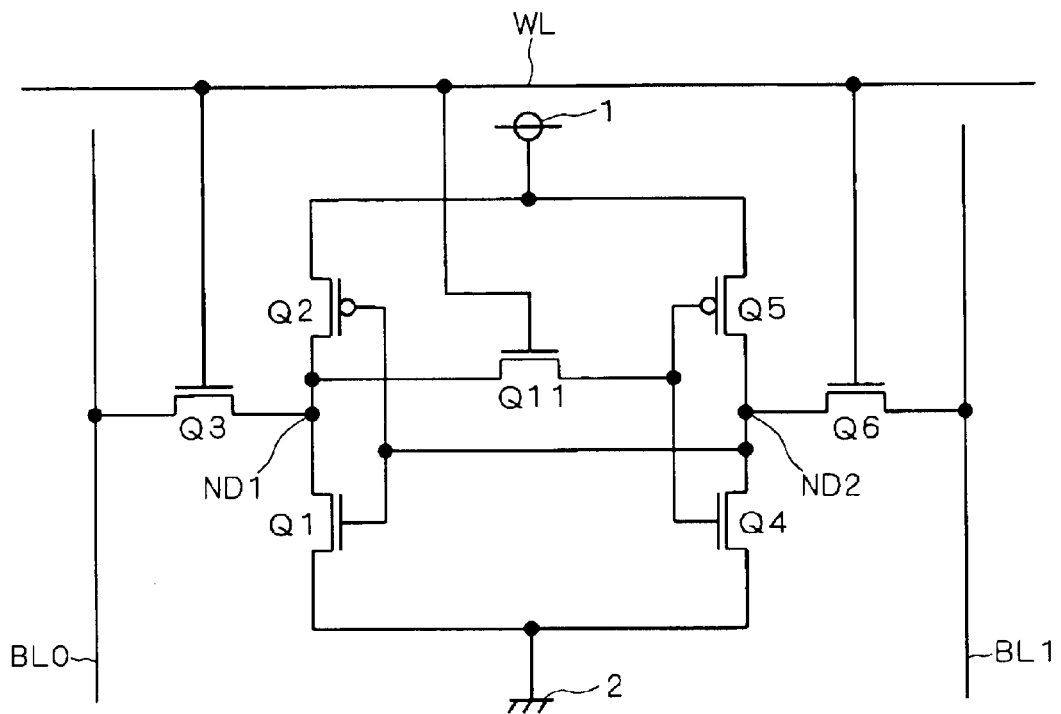
FIG. 13 is a circuit diagram showing the structure of an SRAM memory cell according to a fifth preferred embodiment of the present invention.

FIG. 13 is a circuit diagram showing the structure of an SRAM memory cell according to a fifth preferred embodiment of the invention. It has an NMOS transistor Q11 formed in place of the resistor 3 shown in FIG. 1. The NMOS transistor Q11 has one of its source and drain connected to the storage node ND1 and the other connected to the gates of the NMOS transistor Q4 and the PMOS transistor Q5. Also the NMOS transistor Q11 has its gate connected to the word line WL.

In order to cause the NMOS transistor Q11 to electrically conduct between the source and drain, a transistor in which its source-channel-drain have $n^+$-n-$n^+$ conductivity types is adopted as the NMOS transistor Q11. Alternatively an absolute value of the threshold voltage of the NMOS transistor Q11 is set lower than those of other NMOS transistors Q1 and Q4. For example, it is set low so that application of a 0-V voltage to the gate results in a current flow of about several microamperes ($\mu$A) to several milliamperes (mA). In other respects the structure of the SRAM memory cell of the fifth preferred embodiment is the same as that of the SRAM memory cell shown in FIG. 1 in the first preferred embodiment.

As shown above, according to the semiconductor storage device of the fifth preferred embodiment, the resistance between the source and drain of the NMOS transistor Q11 can be added between the storage node ND1 and the gates of the NMOS transistor Q4 and the PMOS transistor Q5, which provides the same effect as that of the third preferred embodiment.

Furthermore, the gate of the NMOS transistor Q11 is connected to the word line WL, so that, when the word line WL is activated during data writing and reading, the voltage applied to the word line WL is applied also to the gate of the NMOS transistor Q11 to activate the NMOS transistor Q11. This lowers the resistance between the source and drain of the NMOS transistor Q11, suppressing operation delay in data writing and reading.

Sixth Preferred Embodiment

Figure 14:
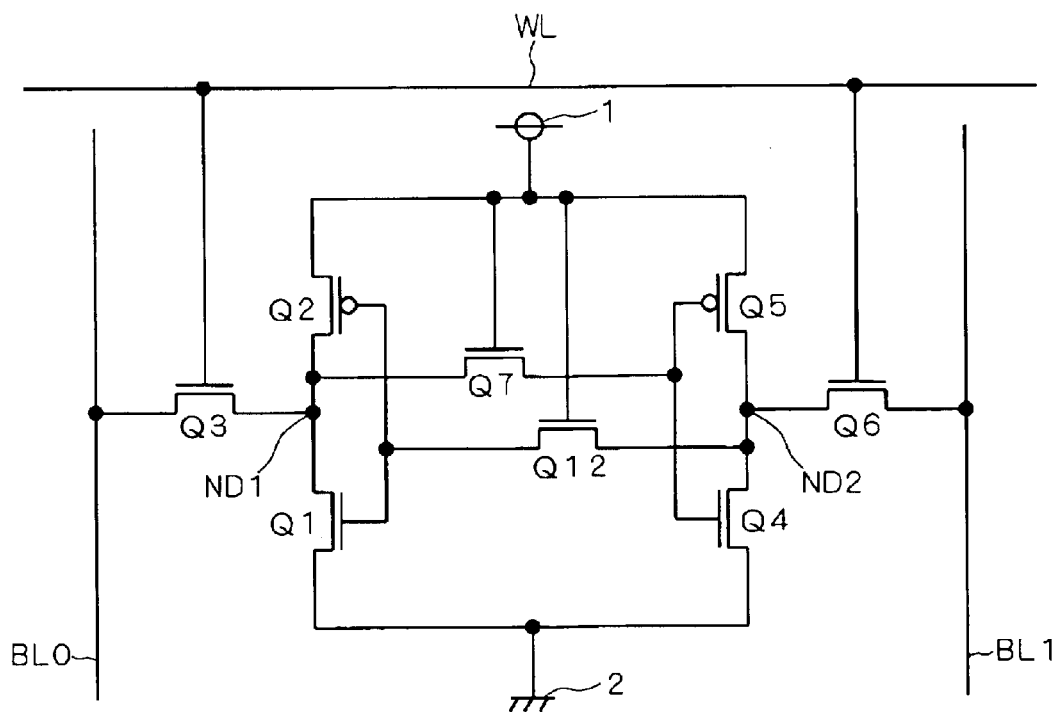
FIG. 14 is a circuit diagram showing the structure of an SRAM memory cell according to a sixth preferred embodiment of the present invention.

FIG. 14 is a circuit diagram showing the structure of an SRAM memory cell according to a sixth preferred embodiment of the invention. The storage node ND2 is connected through an NMOS transistor Q12 to the gates of the NMOS transistor Q1 and the PMOS transistor Q2. The NMOS transistor Q12 has one of its source and drain connected to the storage node ND2 and the other connected to the gates of the NMOS transistor Q1 and the PMOS transistor Q2. The NMOS transistor Q12 has its gate connected to the power supply 1, as in the third preferred embodiment. However, the gate of the NMOS transistor Q12 may be connected to its own source or drain as in the fourth preferred embodiment, or to the word line WL as in the fifth preferred embodiment. This applies also to the gate of the NMOS transistor Q7. In other respects the structure of the SRAM memory cell of the sixth preferred embodiment is the same as that shown in FIG. 1 in the first preferred embodiment.

As shown above, according to the semiconductor storage device of the sixth preferred embodiment, as shown in FIG. 14, the storage node ND1 is connected through the NMOS transistor Q7 to the gates of the NMOS transistor Q4 and the PMOS transistor Q5. Also, the storage node ND2 is connected through the NMOS transistor Q12 to the gates of the NMOS transistor Q1 and the PMOS transistor Q2. This further enhances the soft-error immunity as compared with the semiconductor storage devices of the third to fifth preferred embodiments.

Seventh Preferred Embodiment

A seventh preferred embodiment describes the structure of the added MOS transistors (referred to as "resistance-adding transistors" hereinafter). Examples of the structure of the NMOS transistor Q12 shown in FIG. 14 are now described.

Figure 15:
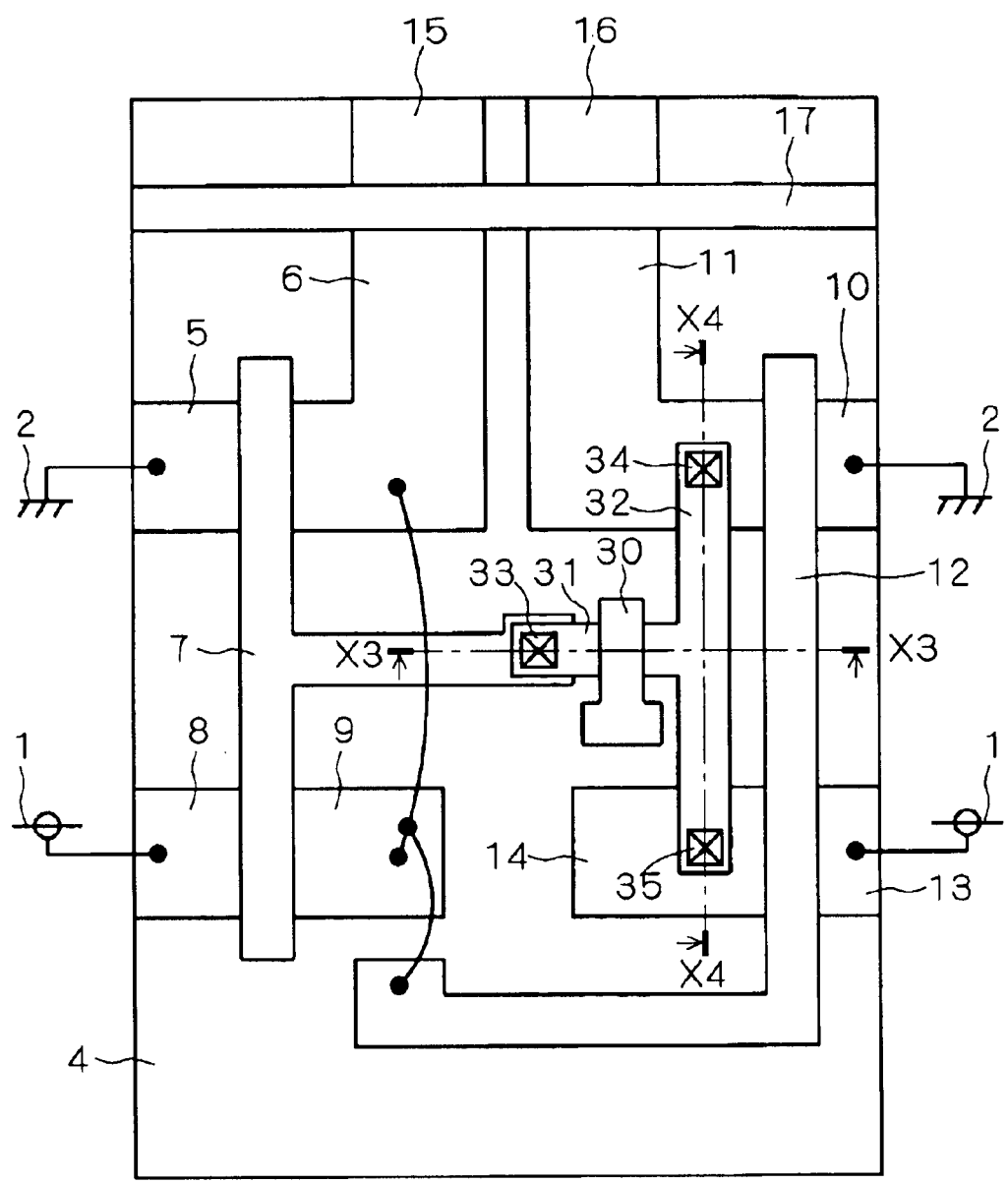
FIG. 15 is a top view schematically showing the structure of an SRAM memory cell according to a seventh preferred embodiment of the present invention.
Figure 16:
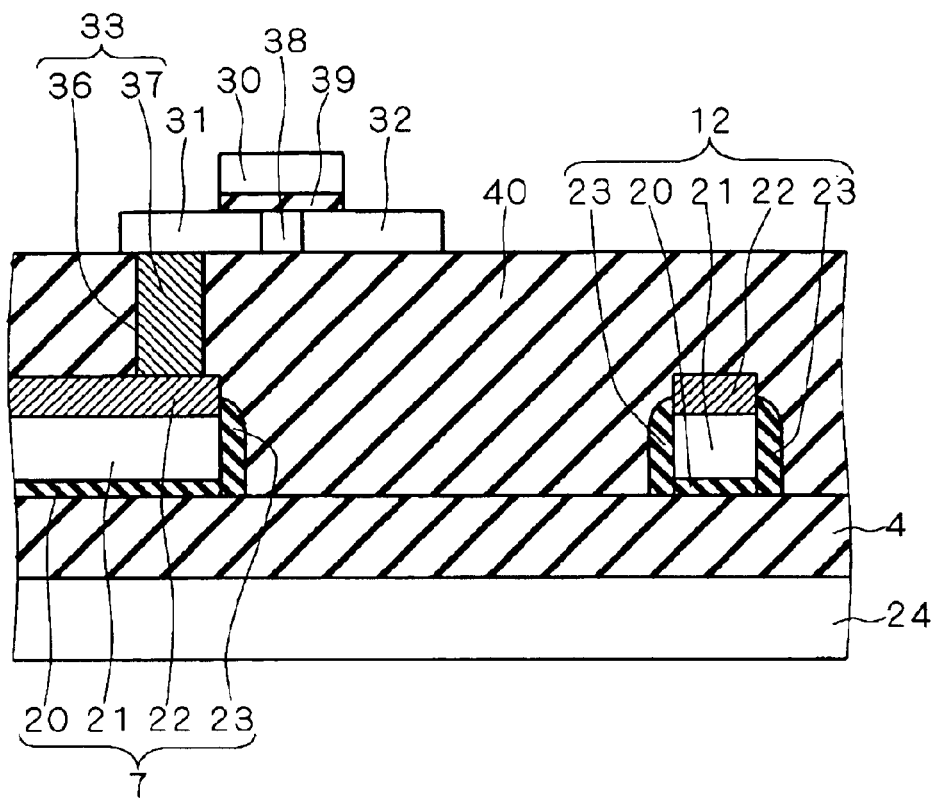
FIG. 16 is a cross section showing the sectional structure taken along the segment X3—X3 shown in FIG. 15.
Figure 17:
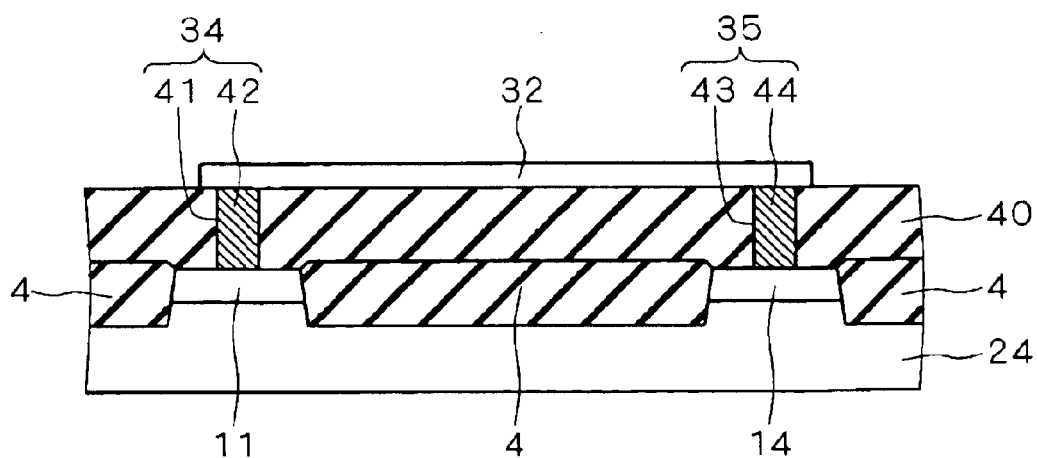
FIG. 17 is a cross section showing the sectional structure taken along the segment X4—X4 shown in FIG. 15.

FIG. 15 is a top view schematically showing the structure of an SRAM memory cell according to the seventh preferred embodiment of the invention. FIG. 16 is a cross section showing the sectional structure taken along the segment X3—X3 shown in FIG. 15 and FIG. 17 is a cross section showing the sectional structure taken along the segment X4—X4 shown in FIG. 15. As shown in FIGS. 16 and 17, an interlayer insulating film 40 composed of a silicon oxide film is formed on the silicon substrate 24 and the element isolation insulating film 4, and the NMOS transistor Q12 is a thin-film transistor (TFT) formed on the interlayer insulating film 40.

Referring to FIGS. 15 to 17, the NMOS transistor Q12 has a channel region 38 and a pair of source/drain regions 31 and 32 formed on the sides of the channel region 38; the channel region 38 and the source/drain regions 31 and 32 are all formed on the interlayer insulating film 40. The NMOS transistor Q12 also has a gate electrode 30 formed above the channel region 38 with a gate insulating film 39 interposed therebetween. The source/drain regions 31 and 32 have $n^+$-type conductivity and the channel region 38 has p-type conductivity. However, note that the channel region 38 has n-type conductivity in the NMOS transistor Q9 shown in FIGS. 10 and 12 and the NMOS transistor Q11 shown in FIG. 13.

Referring to FIG. 15, the source/drain region 31 is connected to the gate structure 7 through a contact plug 33. The source/drain region 32 is connected to the drain regions 11 and 14 through contact plugs 34 and 35, respectively. Referring to FIG. 16, the contact plug 33 has a contact hole 36 formed in the interlayer insulating film 40 between the bottom of the source/drain region 31 and the top of the gate structure 7 and a metal plug 37 filling the contact hole 36. Referring to FIG. 17, the contact plug 34 has a contact hole 41 formed in the interlayer insulating film 40 between the bottom of the source/drain region 32 and the top of the drain region 11 and a metal plug 42 filling the contact hole 41. The contact plug 35 has a contact hole 43 formed in the interlayer insulating film 40 between the bottom of the source/drain region 32 and the top of the drain region 14 and a metal plug 44 filling the contact hole 43.

As shown above, according to the semiconductor storage device of the seventh preferred embodiment, the resistance-adding transistor is formed on the interlayer insulating film 40, which suppresses increase in chip area, as compared with a structure in which the resistance-adding transistor is formed on the silicon substrate 24 together with other MOS transistors Q1 to Q6.

Figure 18:
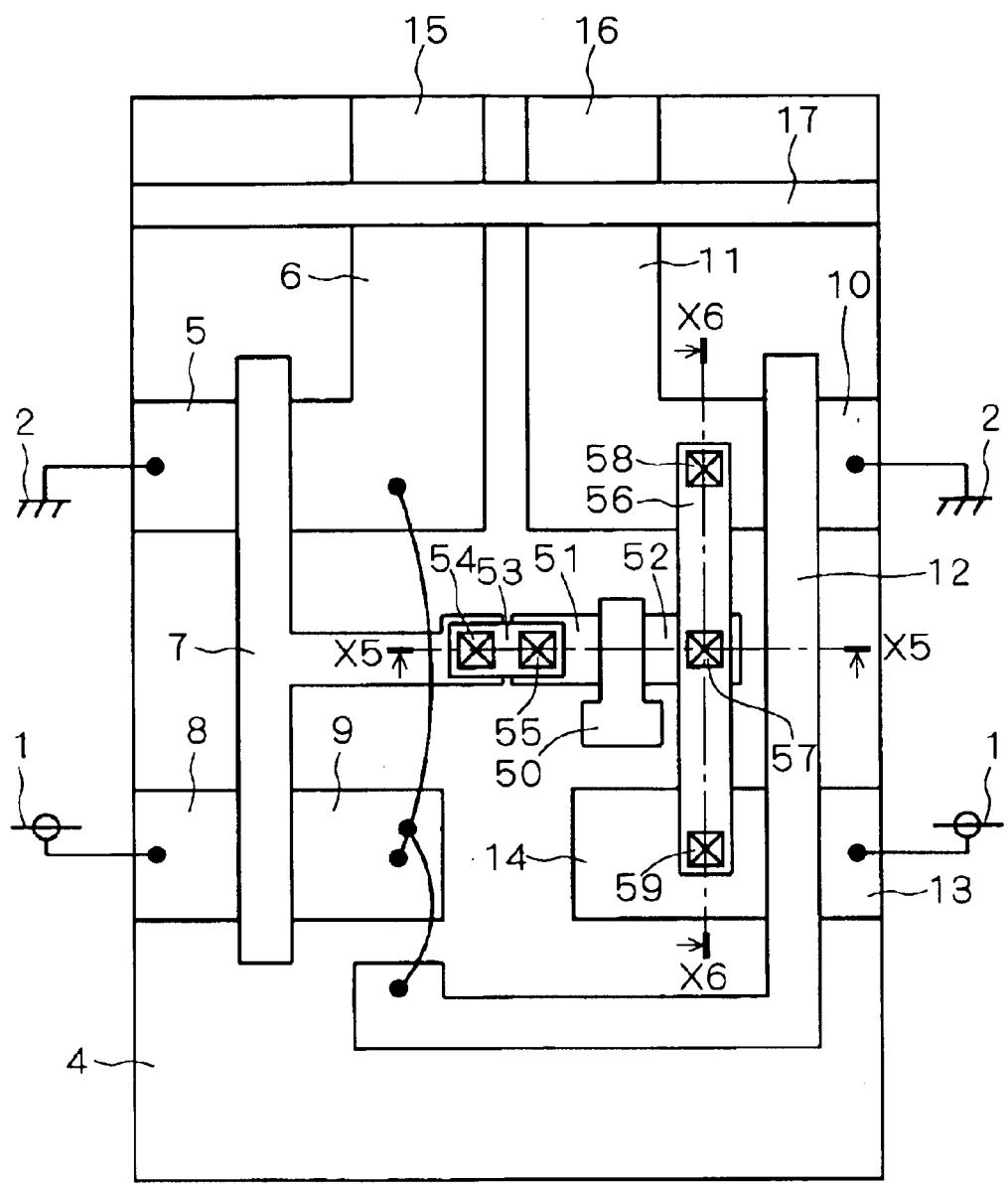
FIG. 18 is a top view schematically showing the structure of an SRAM memory cell according to a first variation of the seventh preferred embodiment of the present invention.
Figure 19:
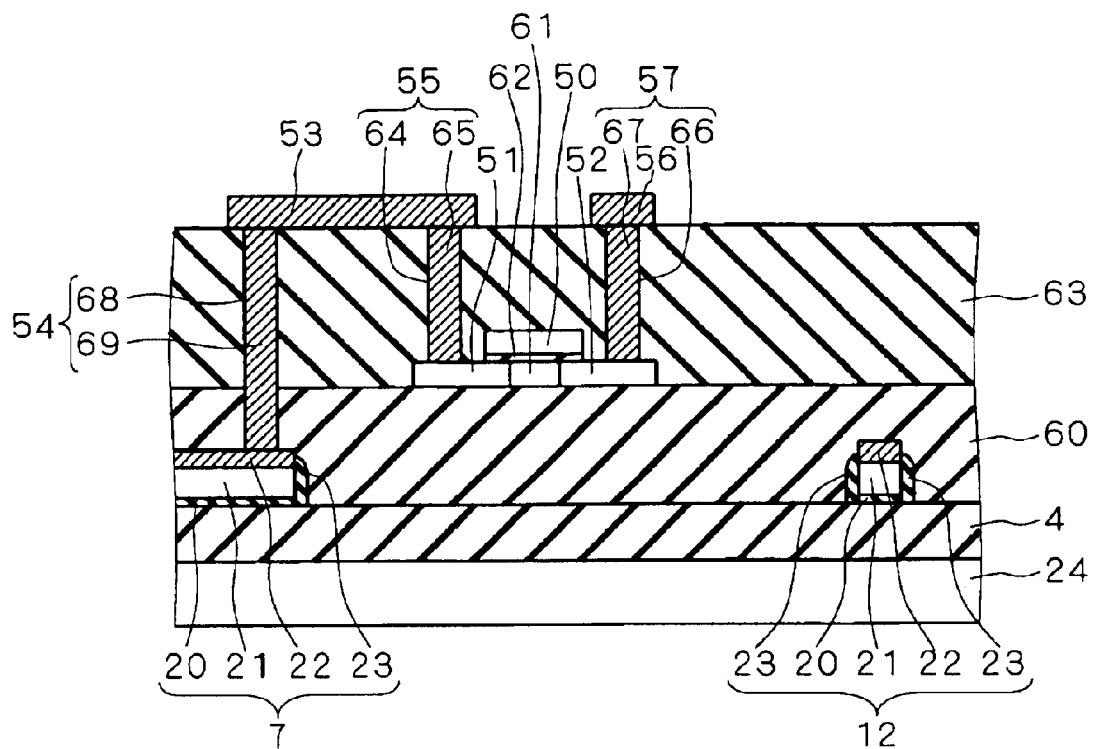
FIG. 19 is a cross section showing the sectional structure taken along the segment X5—X5 shown in FIG. 18.
Figure 20:
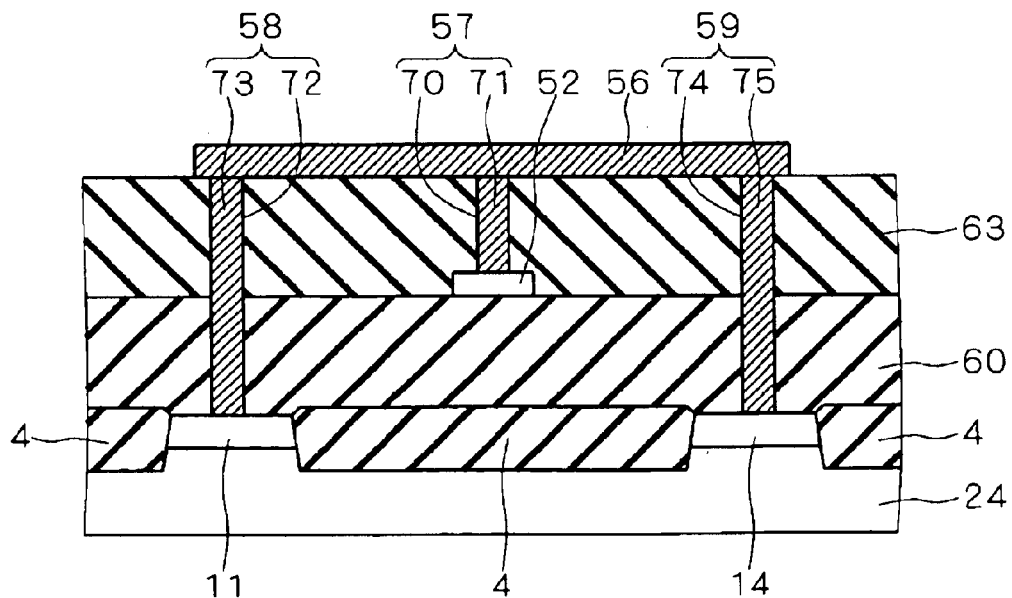
FIG. 20 is a cross section showing the sectional structure taken along the segment X6—X6 shown in FIG. 18.

FIG. 18 is a top view schematically showing the structure of an SRAM memory cell according to a first variation of the seventh preferred embodiment of the invention. FIG. 19 is a cross section showing the sectional structure taken along the segment X5—X5 shown in FIG. 18 and FIG. 20 is a cross section showing the sectional structure taken along the segment X6—X6 shown in FIG. 18. As shown in FIGS. 19 and 20, an interlayer insulating film 60 composed of a silicon oxide film is formed on the silicon substrate 24 and the element isolation insulating film 4, and an interlayer insulating film 63 of a silicon oxide film is formed on the interlayer insulating film 60. The NMOS transistor Q12 is a thin-film transistor formed on the interlayer insulating film 60.

Referring to FIGS. 18 to 20, the NMOS transistor Q12 has a channel region 61 and a pair of source/drain regions 51 and 52 formed on the sides of the channel region 61; the channel region 61 and the source/drain regions 51 and 52 are all formed on the interlayer insulating film 60. The NMOS transistor Q12 also has a gate electrode 50 formed above the channel region 61 with a gate insulating film 62 interposed therebetween. The source/drain regions 51 and 52 have $n^+$-type conductivity and the channel region 61 has p-type conductivity. However, note that the channel region 61 has n-type conductivity in the NMOS transistor Q9 shown in FIGS. 10 and 12 and the NMOS transistor Q11 shown in FIG. 13.

Referring to FIG. 18, the source/drain region 51 is connected to the gate structure 7 through contact plugs 54 and 55 and a metal interconnection 53 composed of aluminum. The source/drain region 52 is connected to the drain region 11 through contact plugs 57 and 58 and a metal interconnection 56. The source/drain region 52 is connected also to the drain region 14 through the contact plugs 57 and 59 and the metal interconnection 56.

Referring to FIG. 19, the contact plug 55 has a contact hole 64 formed in the interlayer insulating film 63 between the top of the source/drain region 51 and the bottom of the metal interconnection 53 and a metal plug 65 filling the contact hole 64. The contact plug 57 has a contact hole 66 formed in the interlayer insulating film 63 between the top of the source/drain region 52 and the bottom of the metal interconnection 56 and a metal plug 67 filling the contact hole 66. The contact plug 54 has a contact hole 68 formed in the interlayer insulating films 60 and 63 between the top of the gate structure 7 and the bottom of the metal interconnection 53 and a metal plug 69 filling the contact hole 68.

Referring to FIG. 20, the contact plug 57 has a contact hole 70 formed in the interlayer insulating film 63 between the top of the source/drain region 52 and the bottom of the metal interconnection 56 and a metal plug 71 filling the contact hole 70. The contact plug 58 has a contact hole 72 formed in the interlayer insulating films 60 and 63 between the bottom of the metal interconnection 56 and the top of the drain region 11 and a metal plug 73 filling the contact hole 72. The contact plug 59 has a contact hole 74 formed in the interlayer insulating films 60 and 63 between the bottom of the metal interconnection 56 and the top of the drain region 14 and a metal plug 75 filling the contact hole 74.

Figure 21:
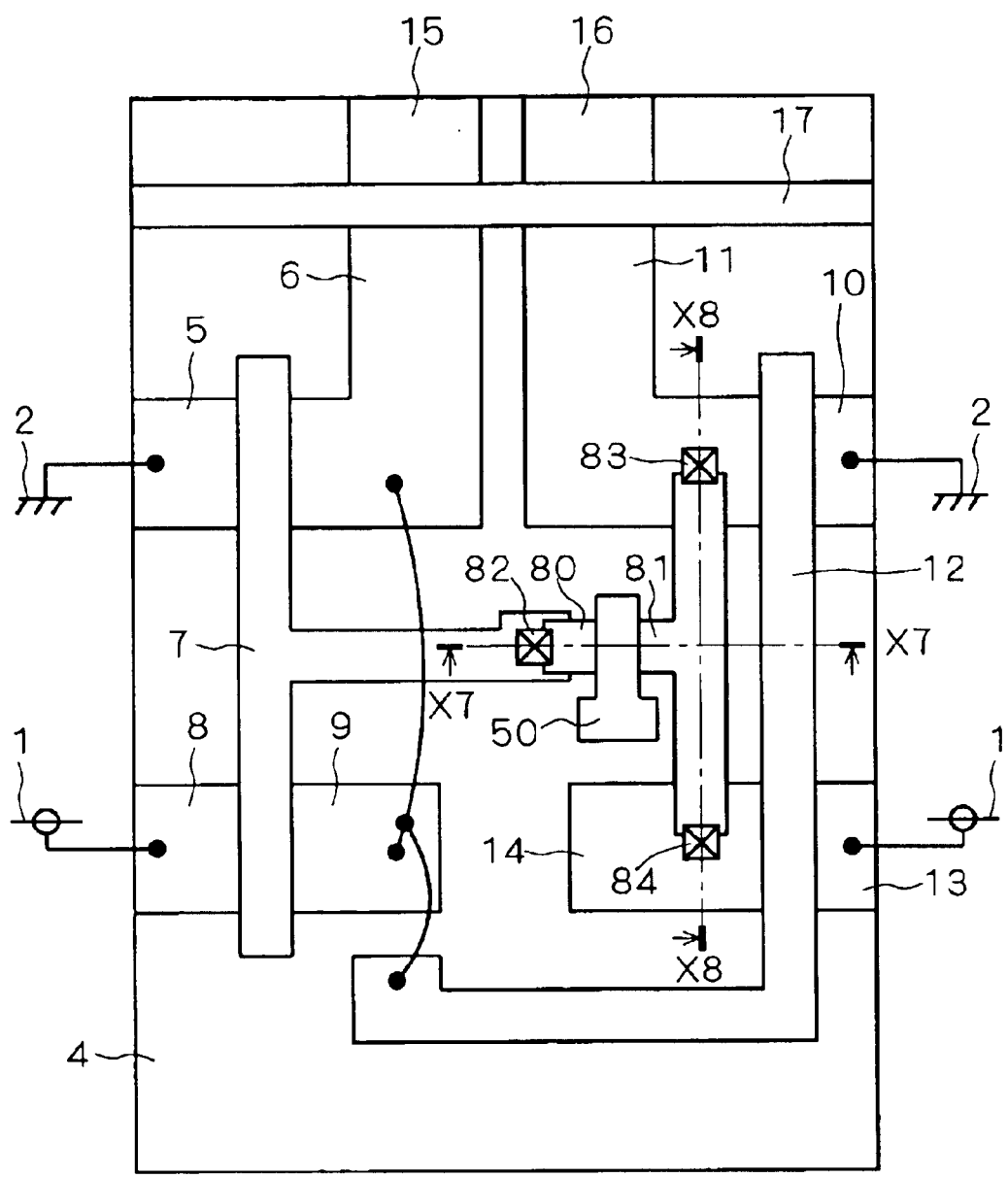
FIG. 21 is a top view schematically showing the structure of an SRAM memory cell according to a second variation of the seventh preferred embodiment of the present invention.
Figure 22:
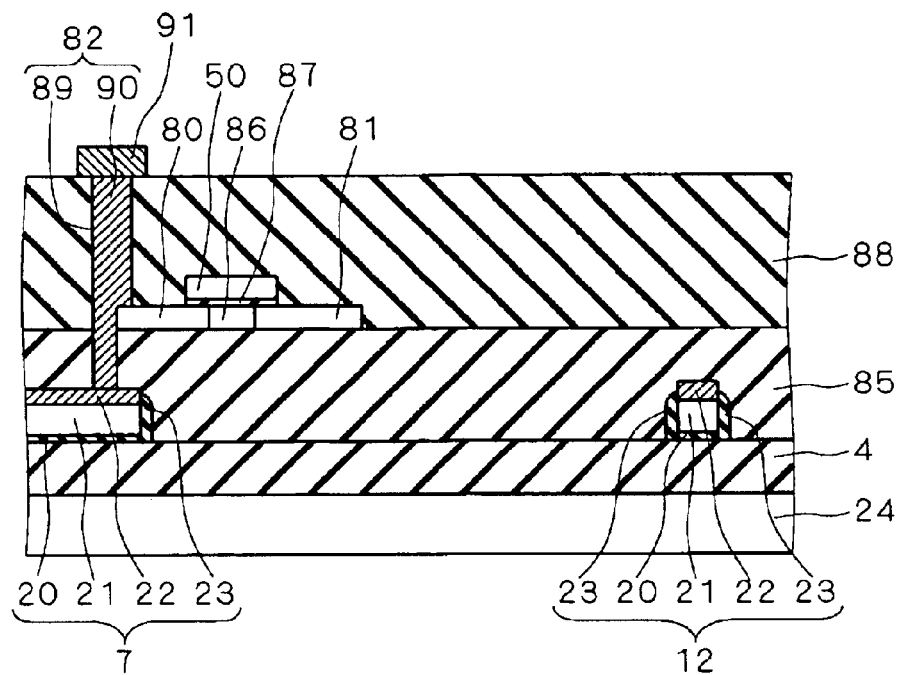
FIG. 22 is a cross section showing the sectional structure taken along the segment X7—X7 shown in FIG. 21.
Figure 23:
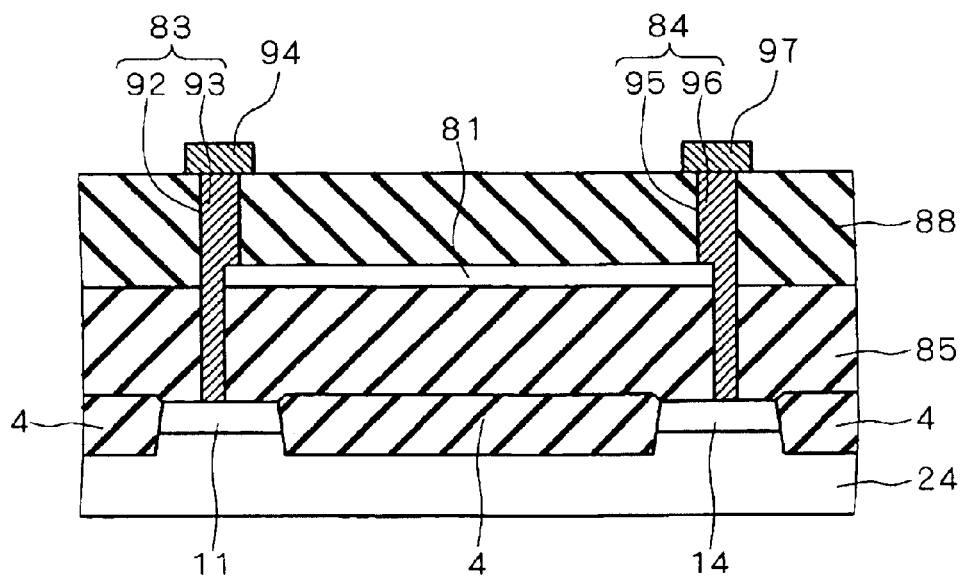
FIG. 23 is a cross section showing the sectional structure taken along the segment X8—X8 shown in FIG. 21.
Figure 24:
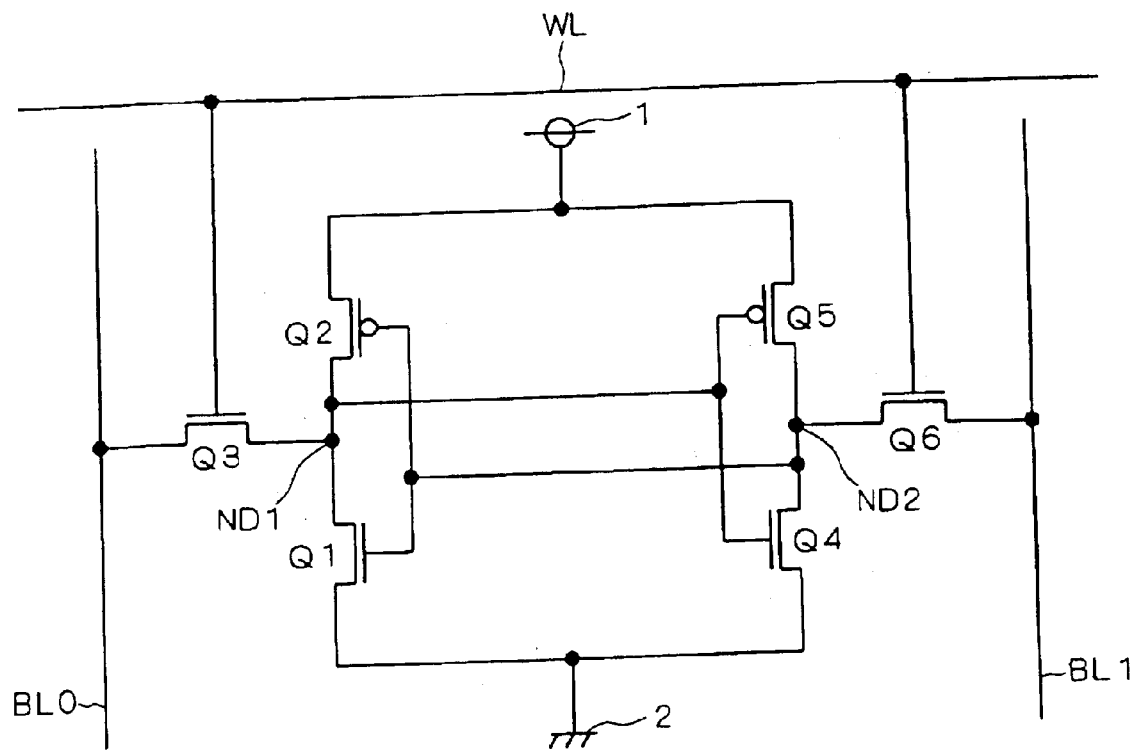
FIG. 24 is a circuit diagram showing the structure of a conventional SRAM memory cell.
Figure 25:
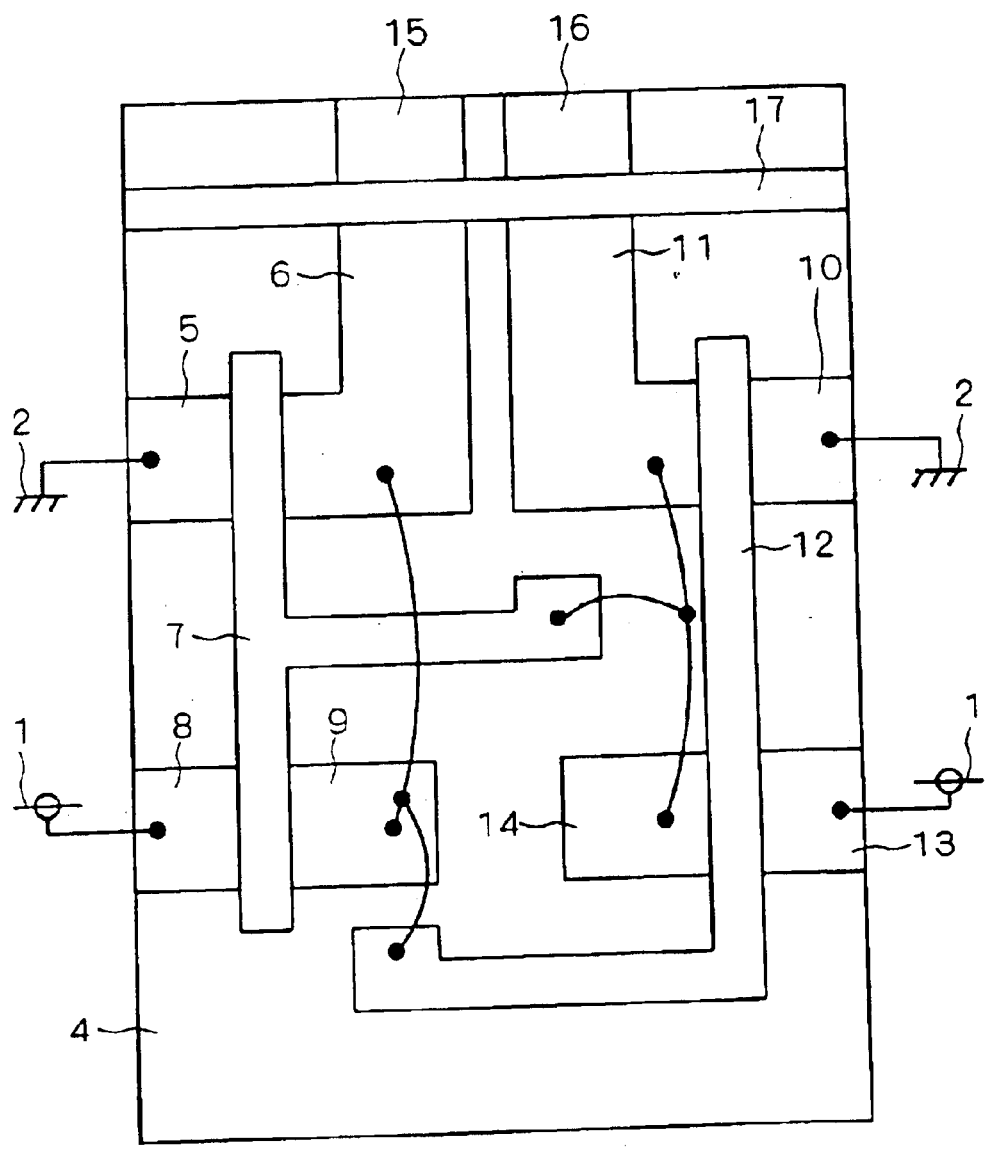
FIG. 25 is a top view schematically showing the structure of the conventional SRAM memory cell.

FIG. 21 is a top view schematically showing the structure of an SRAM memory cell according to a second variation of the seventh preferred embodiment of the invention. FIG. 22 is a cross section showing the sectional structure taken along the segment X7—X7 shown in FIG. 21 and FIG. 23 is a cross section showing the sectional structure taken along the segment X8—X8 shown in FIG. 21. As shown in FIGS. 22 and 23, an interlayer insulating film 85 composed of a silicon oxide film is formed on the silicon substrate 24 and the element isolation insulating film 4, and an interlayer insulating film 88 of a silicon oxide film is formed on the interlayer insulating film 85. The NMOS transistor Q12 is a thin-film transistor formed on the interlayer insulating film 85.

Referring to FIGS. 21 to 23, the NMOS transistor Q12 has a channel region 86 and a pair of source/drain regions 80 and 81 formed on the sides of the channel region 86; the channel region 86 and the source/drain regions 80 and 81 are all formed on the interlayer insulating film 85. The NMOS transistor Q12 also has a gate electrode 50 formed above the channel region 86 with a gate insulating film 87 interposed therebetween. The source/drain regions 80 and 81 have $n^+$-type conductivity and the channel region 86 has p-type conductivity. However, note that the channel region 86 has n-type conductivity in the NMOS transistor Q9 shown in FIGS. 10 and 12 and the NMOS transistor Q11 shown in FIG. 13.

Referring to FIG. 21, the source/drain region 80 is connected to the gate structure 7 through a contact plug 82. The source/drain region 81 is connected to the drain regions 11 and 14 through contact plugs 83 and 84, respectively.

Referring to FIG. 22, the contact plug 82 has a contact hole 89 formed in the interlayer insulating films 85 and 88 between the top of the gate structure 7 and the bottom of the metal interconnection 91 and a metal plug 90 filling the contact hole 89; the contact hole 89 exposes the end of the source/drain region 80 on the side opposite to the channel region 86.

Referring to FIG. 23, the contact plug 83 has a contact hole 92 formed in the interlayer insulating films 85 and 88 between the top of the drain region 11 and the bottom of the metal interconnection 94 and a metal plug 93 filling the contact hole 92; the contact hole 92 exposes one end of the source/drain region 81. The contact plug 84 has a contact hole 95 formed in the interlayer insulating films 85 and 88 between the top of the drain region 14 and the bottom of the metal interconnection 97 and a metal plug 96 filling the contact hole 95; the contact hole 95 exposes the other end of the source/drain region 81.

The semiconductor storage devices of the first and second variations of the seventh preferred embodiment provide the same effects as the semiconductor storage devices shown in FIGS. 15 to 17.

While the invention has been described in detail, the foregoing description is in all aspects illustrative and not restrictive. It is understood that numerous other modifications and variations can be devised without departing from the scope of the invention.

What is claimed is:

1. A semiconductor storage device comprising a static random access memory cell which comprises a first driver transistor, a first load element, and a first access transistor which are connected to each other through a first storage node, and a second driver transistor, a second load element, and a second access transistor which are connected to each other through a second storage node, said first driver transistor having a first gate electrode connected to said second storage node and said second driver transistor having a second gate electrode connected to said first storage node, said semiconductor storage device further comprising a first protection film formed to completely cover part of said first gate electrode with respect to a direction in which said first gate electrode extends, wherein part of said first gate electrode which is not covered by said first protection film has a structure in which a first semiconductor layer and a first metal-semiconductor compound layer are stacked in this order on a first gate insulating film, and the part of said first gate electrode which is covered by said first protection film has a structure in which said first semiconductor layer is formed on said first gate insulating film and said first metal-semiconductor compound layer is not formed on said first semiconductor layer.

2. The semiconductor storage device according to claim 1, further comprising a second protection film formed to cover part of said second gate electrode, wherein part of said second gate electrode which is not covered by said second protection film has a structure in which a second semiconductor layer and a second metal-semiconductor compound layer are stacked in this order on a second gate insulating film, and the part of said second gate electrode which is covered by said second protection film has a structure in which said second semiconductor layer is formed on said second gate insulating film and said second metal-semiconductor compound layer is not formed on said second semiconductor layer.

3. A semiconductor storage device comprising a static random access memory cell which comprises a first driver transistor, a first load element, and a first access transistor which are connected to each other through a first storage node, and a second driver transistor, a second load element, and a second access transistor which are connected to each other through a second storage node, said first driver transistor having a first gate electrode connected to said second storage node, said second driver transistor having a second gate electrode connected to said first storage node, said semiconductor storage device further comprising a first protection film formed to cover part of said first gate electrode, wherein part of said first gate electrode which is not covered by said first protection film has a structure including a first semiconductor layer on a first gate insulating film and a first metal-semiconductor compound layer directly on said first semiconductor layer, and the part of said first gate electrode which is covered by said first protection film has a structure in which said first semiconductor layer is formed on said first gate insulating film and said first metal-semiconductor compound layer is not formed on said first semiconductor layer.

4. The semiconductor storage device according to claim 3, further comprising a second protection film formed to cover part of said second gate electrode, wherein part of said second gate electrode which is not covered by said second protection film has a structure in which a second semiconductor layer and a second metal-semiconductor compound layer are stacked in this order on a second gate insulating film, and the part of said second gate electrode which is covered by said second protection film has a structure in which said second semiconductor layer is formed on said second gate insulating film and said second metal-semiconductor compound layer is not formed on said second semiconductor layer.

5. The semiconductor storage device according to claim 1, wherein said first protection film is formed only in an element isolation region.

* * * * *